United States Patent
Heydari

(10) Patent No.: US 9,198,321 B1
(45) Date of Patent: Nov. 24, 2015

(54) SERVER CHASSIS BRACKET

(71) Applicant: Twitter, Inc., San Francisco, CA (US)

(72) Inventor: Ali Heydari, Albany, CA (US)

(73) Assignee: Twitter, Inc., San Francisco, CA (US)

(*) Notice: Subject to any disclaimer, the term of this patent is extended or adjusted under 35 U.S.C. 154(b) by 0 days.

(21) Appl. No.: 14/329,721

(22) Filed: Jul. 11, 2014

Related U.S. Application Data

(63) Continuation-in-part of application No. 13/764,537, filed on Feb. 11, 2013, now Pat. No. 8,953,329.

(51) Int. Cl.
*H05K 7/00* (2006.01)
*H05K 7/14* (2006.01)
*H05K 7/12* (2006.01)

(52) U.S. Cl.
CPC .............. *H05K 7/1488* (2013.01); *H05K 7/12* (2013.01)

(58) Field of Classification Search
CPC .................................... H05K 7/00; H05K 7/12
USPC ................. 361/726, 740, 735, 741, 742, 732; 248/103, 65
See application file for complete search history.

(56) References Cited

U.S. PATENT DOCUMENTS

| | | | |
|---|---|---|---|
| 8,625,288 B1* | 1/2014 | Liu et al. .................... | 361/727 |
| 2002/0054475 A1 | 5/2002 | Boss et al. | |
| 2008/0135705 A1* | 6/2008 | Chuang .................... | 248/243 |
| 2009/0159241 A1* | 6/2009 | Lipp et al. ................. | 165/80.2 |
| 2010/0039765 A1 | 2/2010 | Antonuccio et al. | |
| 2013/0240464 A1* | 9/2013 | Sauer ......................... | 211/26 |
| 2014/0252197 A1 | 9/2014 | Doglio | |

* cited by examiner

*Primary Examiner* — Dion R Ferguson
*Assistant Examiner* — Mandeep Buttar
(74) *Attorney, Agent, or Firm* — Osha Liang LLP

(57) ABSTRACT

An apparatus including: a server component bracket having: a first set of holes configured to secure a set of grommets gripping a server component; a set of connectors; and a plunger comprising a pin and configured to generate an audio verification of successful installation of the server component bracket; and a server chassis bracket having: a set of sidewalls; a second set of holes configured to secure the set of connectors of the server component bracket; a side rail configured to guide the set of connectors into the second set of holes; and an aperture configured to secure the pin of the plunger following successful installation of the server component bracket into the server chassis bracket.

20 Claims, 15 Drawing Sheets

Grommet Dimensions 515

| Load (lb) | Dimensions (inches) | | | | | | | |
|---|---|---|---|---|---|---|---|---|
| Recommended Maximum | a Plate Thckns. | b Hole Diam. | c Inside Diam. | d Overall Height | e Outside Diam. | f Edge Radius | g Rib Height | h Rib Width |
| 3.0 | 0.057 | 0.250 | 0.158 | 0.230 | 0.379 | 0.050 | 0.040 | 0.050 |

Grommet Material 520

| C-1105 - Vinyl Solid | V-2325 TPR Thermoplastic |

SERVER CHASSIS BRACKET

CROSS-REFERENCE TO RELATED APPLICATIONS

This application is a continuation-in-part (CIP) application of U.S. patent application Ser. No. 13/764,537, filed on Feb. 11, 2013, and entitled: "Server Chassis Bracket." Accordingly, this CIP patent application claims benefit of U.S. patent application Ser. No. 13/764,537 under 35 U.S.C. §120. U.S. patent application Ser. No. 13/764,537 is hereby incorporated in its entirety.

BACKGROUND

In order to be operational, a server requires many components (e.g., hard drives, memory, processors, etc.). Accordingly, there exists a need for an apparatus and method that allows for efficient installation and removal of the server components in view of the limited space that exists within a server chassis.

SUMMARY

In general, in one aspect, the invention relates to an apparatus. The apparatus comprises: a first server component bracket comprising: a first plurality of holes configured to secure a plurality of grommets gripping a server component; a plurality of connectors; and a plunger comprising a pin and configured to generate an audio verification of successful installation of the first server component bracket; and a server chassis bracket comprising: a plurality of sidewalls; a second plurality of holes configured to secure the plurality of connectors of the first server component bracket; a side rail configured to guide the plurality of connectors into the second plurality of holes; and an aperture configured to secure the pin of the plunger following successful installation of the first server component bracket into the server chassis bracket.

In general, in one aspect, the invention relates to a server chassis. The server chassis bracket comprises: a floor and a plurality of sides; a first server chassis bracket comprising a plurality of sidewalls; a first plurality of rivets securing the plurality of sidewalls to the plurality of sides and reducing sagging of the floor by compressing the plurality of sides and bowing the floor; and a first plurality of server component brackets comprising: a plurality of connectors installed in the first server chassis bracket; and a first plurality of holes configured to secure a plurality of grommets gripping a first plurality of server components.

In general, in one aspect, the invention relates to a method, comprising: obtaining a server component bracket comprising: a first plurality of holes securing a plurality of grommets gripping a server component; a plunger comprising a pin; and a plurality of connectors; obtaining a server chassis bracket comprising: a plurality of sidewalls; a second plurality of holes; a side rail; and an aperture; activating the plunger; and sliding the server component bracket along the side rail to guide the plurality connectors into the second plurality of holes and to position the pin above the aperture, wherein the plunger inserts the pin into the aperture and generates an audio verification confirming successful installation of the server component bracket into the server chassis bracket.

Other aspects of the invention will be apparent from the following description and the appended claims.

DETAILED DESCRIPTION

Figure 1:
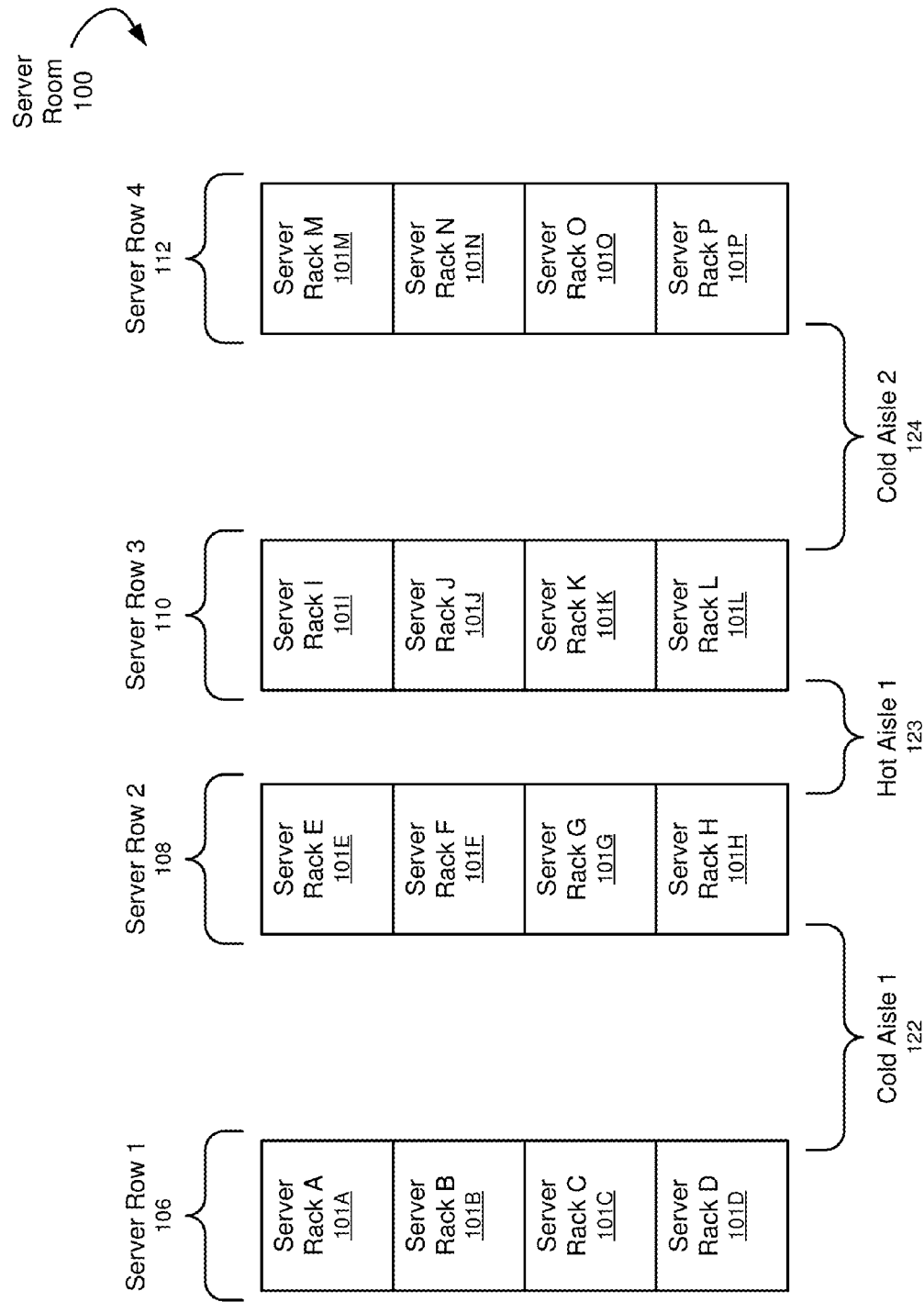
FIG. 1 shows a server room in accordance with one or more embodiments of the invention.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In general, embodiments of the invention relate to a server chassis bracket and a server component bracket. The server component bracket includes multiple holes to secure grommets gripping a server component (e.g., hard drive, memory, etc.). Further, the server component bracket also includes a plunger and multiple connectors to install the server component bracket into the server chassis bracket. The server chassis bracket includes holes to secure the multiple connectors and an aperture to secure a pin of the plunger. The plunger generates an audio verification upon successful installation of the server component bracket in the server chassis bracket. During removal of the server component bracket, one or more stoppers are used to prevent over-sliding of the server component bracket.

In general, embodiments of the invention relate to a server chassis bracket used to reduce the sagging of a server chassis. Specifically, the server chassis houses the server chassis bracket and the installed server components. The sidewalls of the server chassis bracket are secured (e.g., riveted) to the sides of the server chassis. This effectively compresses the sides of the server chassis and causes the floor of the server chassis to bow upwards, counteracting/reducing the sagging. The floor of the server chassis may also be secured to the server chassis bracket.

FIG. 1 shows a server room (100) in accordance with one or more embodiments of the invention. As shown in FIG. 1, the server room (100) has multiple server rows (i.e., Server Row 1 (106), Server Row 2 (108), Server Row 3 (110), Server Row 4 (112)). Moreover, each server row (106, 108, 110, 112) has multiple server racks. For example, server row 1 (106) has server rack A (101A), server rack B (101B), server rack C (101C), and server rack D (101D). Further, server row 2 (108) has server rack E (101E), server rack F (101F), server rack G (101G), and server rack H (101H). Further, server row 3 (110)

has server rack I (101I), server rack J (101J), server rack K (101K), and server rack L (101L). Further still, server row 4 (112) has server rack M (101M), server rack N (101N), server rack O (1010) and server rack P (101P). Each server rack (101A-101P) stores one or more servers and/or power components.

Still referring to FIG. 1, server rows (106, 108, 110, 112) are separated by alternating cold aisles (e.g., Cold Aisle 1 (122), Cold Aisle 2 (124)) and hot aisles (e.g., Hot Aisle 1 (123)). Specifically, the servers in a server rack (101A-101P) draw in cool air from a cold aisle (122, 124) (i.e., to cool the server components) and expel air into a hot aisle. For example, the servers in server row 2 (108) draw in cool air from cold aisle 1 (122), while the servers in server row 3 (110) draw in cool air from cold aisle 2 (124). The servers in server row 2 (108) and server row 3 (110) expel hot air into hot aisle 1 (123).

Figure 2:
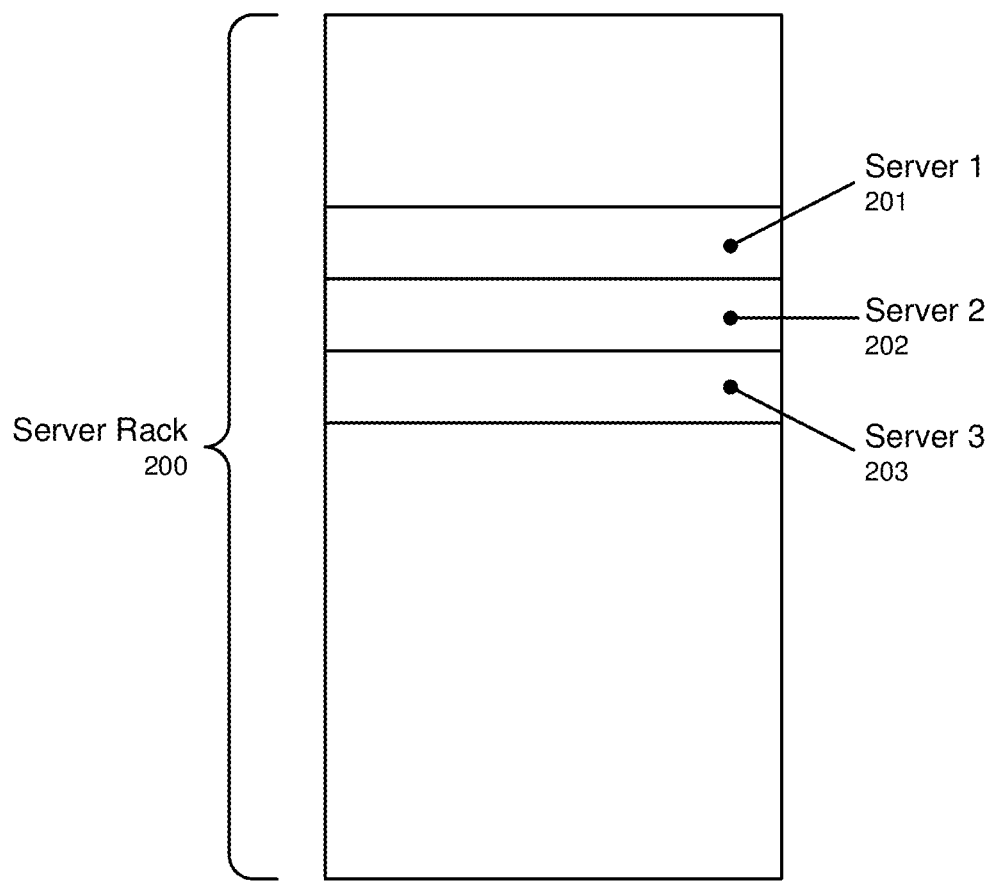
FIG. 2 shows a server rack in accordance with one or more embodiments of the invention.

FIG. 2 shows a server rack (200) in accordance with one or more embodiments of the invention. The server rack (200) may correspond to any of the server racks (101A-101P), discussed above in reference to FIG. 1. As shown in FIG. 2, the server rack (200) houses multiple servers (i.e., Server 1 (201), Server 2 (202), and Server 3 (203)) and/or power components (not shown). The servers (201, 202, 203) are like shelves in the server rack (200). In other words, the servers (201, 202, 203) are held in place by the contact between the sides of the servers (201, 202, 203) and the server rack (200). The server rack (200) may store any number of servers. Moreover, in order to increase the sever capacity of the storage rack (200) (i.e., the number of servers the storage rack can hold), there may be less than 2 mm clearance between two neighboring servers.

Figure 3:
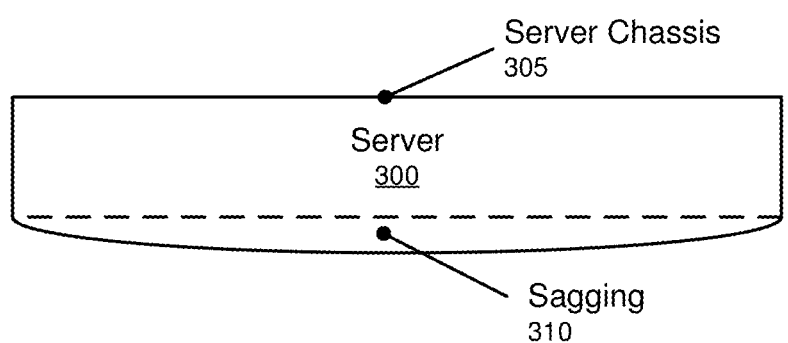
FIG. 3, FIG. 4A, and FIG. 4B show servers in accordance with one or more embodiments of the invention.

FIG. 3 shows a server (300) in accordance with one or more embodiments of the invention. The server (300) may correspond to any of the servers (201, 202, 203) discussed above in reference to FIG. 2. As shown in FIG. 3, the case of the server (300) (i.e., box/shell/structure enclosing all or part of the server (300)) may be referred to as the server chassis (305). The server chassis (305) may have a lid that can be removed to access/install the items (e.g., circuit boards, server components, electrical wiring, fan, fan walls, metal hardware, etc.) within the server chassis (305). Those skilled in the art, having the benefit of this detailed description, will appreciate that as more and more items are mounted/installed/placed within the server (300), the floor of the server chassis (305) may begin to sag from the weight of these items. The sagging (310) may interfere with the tight clearance between neighboring servers in the server rack. Specifically, the sagging (310) may prohibit close placement of neighboring servers within a server rack and thus reduce the overall capacity of the server rack. The dashed lined in FIG. 3 represents the floor of the server chassis (305) when sagging (310) is not present.

Figure 4A:
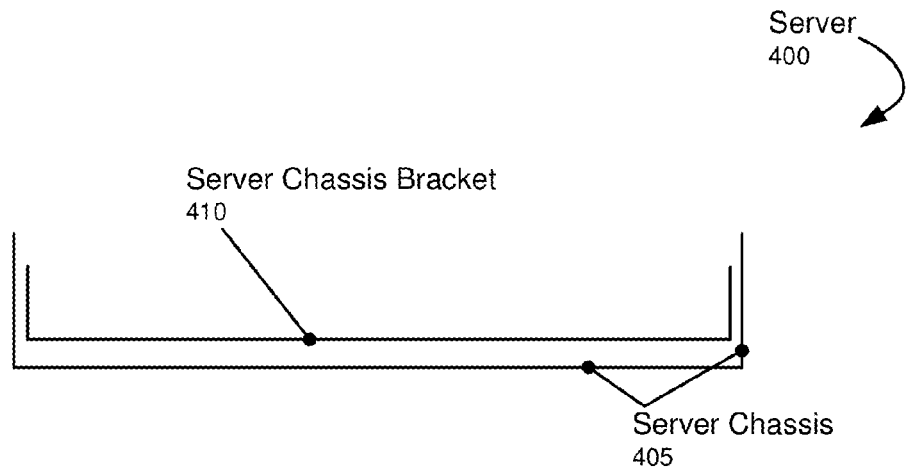

FIG. 4A shows a cross-section of a server (400) in accordance with one or more embodiments of the invention. The server chassis (405) may correspond to the server chassis (305), discussed above in reference to FIG. 3. Although the floor of the server chassis (405) is shown as flat, in one or more embodiments of the invention, the floor of the server chassis bracket (410) is manufactured with a concave shape. The floor of the chassis may be constructed from relatively thin sheet metal. As shown in FIG. 4A, the server includes a server chassis bracket (410). The width of the server chassis bracket (410) is slightly less than the width of the server chassis (405). Moreover, the server chassis bracket (410) may be constructed from material (e.g., metal, plastic, etc.) more rigid than the material of the server chassis (405). In one or more embodiments of the invention, the server chassis bracket (410) and the server chassis (405) are constructed from the same or similar material. In this case, the greater relative rigidity of the server chassis bracket (410) (as compared to the server chassis (405)) can be due to a shape of the server chassis bracket (410). For example, the server chassis bracket (410) can have a thicker cross-section than the server chassis (405) and/or can be reinforced with one or more intersecting struts to add structural rigidity.

Figure 4B:
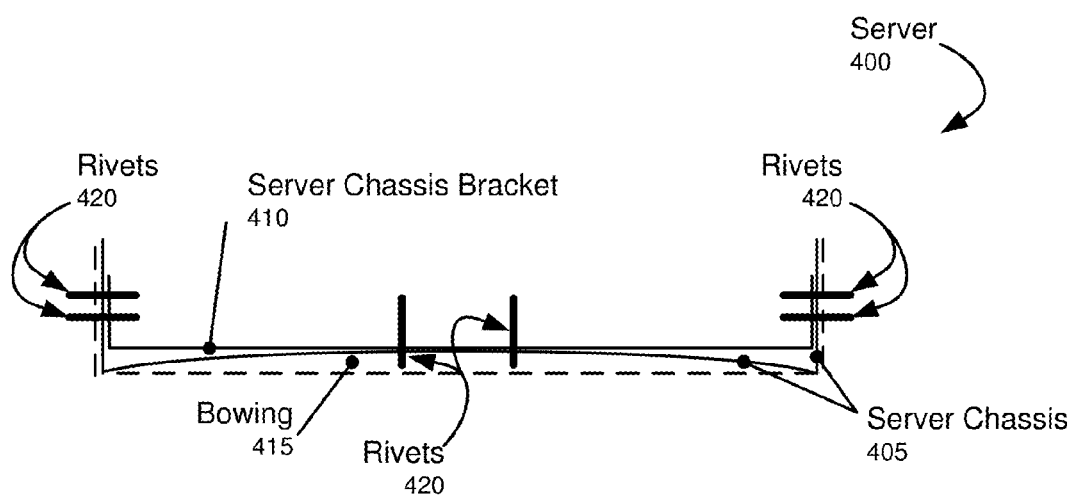

FIG. 4B shows the cross-section of the server (400) after securing the server chassis bracket (410) to the server chassis (405). As shown in FIG. 4B, one or more rivets (420) are used to secure the server chassis bracket (410) to the server chassis (405). In one or more embodiments of the invention, only the side walls of the server chassis bracket (410) are secured to the sides of the server chassis (405). In one or more embodiments of the invention, the floor of the server chassis (405) is also secured to the server chassis bracket (410).

As discussed above, the width of the server chassis bracket (410) is slightly less than the width of the server chassis (405). Accordingly, by securing the sidewalls of the server chassis bracket (410) to the sides of the server chassis (405), the sides of the server chassis (405) are compressed, and the floor of the server chassis (405) bows upwards as a result. This bowing (415) may act as a countermeasure to the sagging (310), discussed above in reference to FIG. 3. In other words, this bowing (415) may reduce or even eliminate the sagging (310), and thus permit close placement of neighboring servers within a server rack (i.e., increasing capacity of the server rack). The dashed lines in FIG. 4B represent the floor of the server chassis (405) prior to bowing and the sides of the server chassis (405) prior to compression. Any number of rivets can be placed at any location in order to secure the sides of the server chassis (405) to the sidewalls of the server chassis bracket (410), in accordance with various embodiments of the invention. Similarly, any number of rivets can be placed at any location in order to secure the floor of the server chassis (405) to the server chassis bracket (410), in accordance with various embodiments of the invention. For example, a single rivet placed at a mid-point of the server chassis bracket (410) can be used to secure each server chassis bracket (410) to the floor of the server chassis (405). Furthermore, in one or more embodiments of the invention, the rivets can be secured in a specific order in order to ensure that the upward bowing of the floor of the server chassis (405) takes place. For example, one or more rivets can be used to secure the floor of the server chassis (405) to the server chassis bracket (410) prior to securing the securing the sidewalls of the server chassis bracket (410) to the sides of the server chassis (405).

Although FIG. 4B only shows a single server chassis bracket (410) mounted within the server chassis (405), any number (e.g., 3) of server chassis brackets may be mounted within the server chassis (405), and one or more of the server chassis brackets may be secured to the server chassis (405), as discussed above, to reduce sagging (310).

Figure 5A:
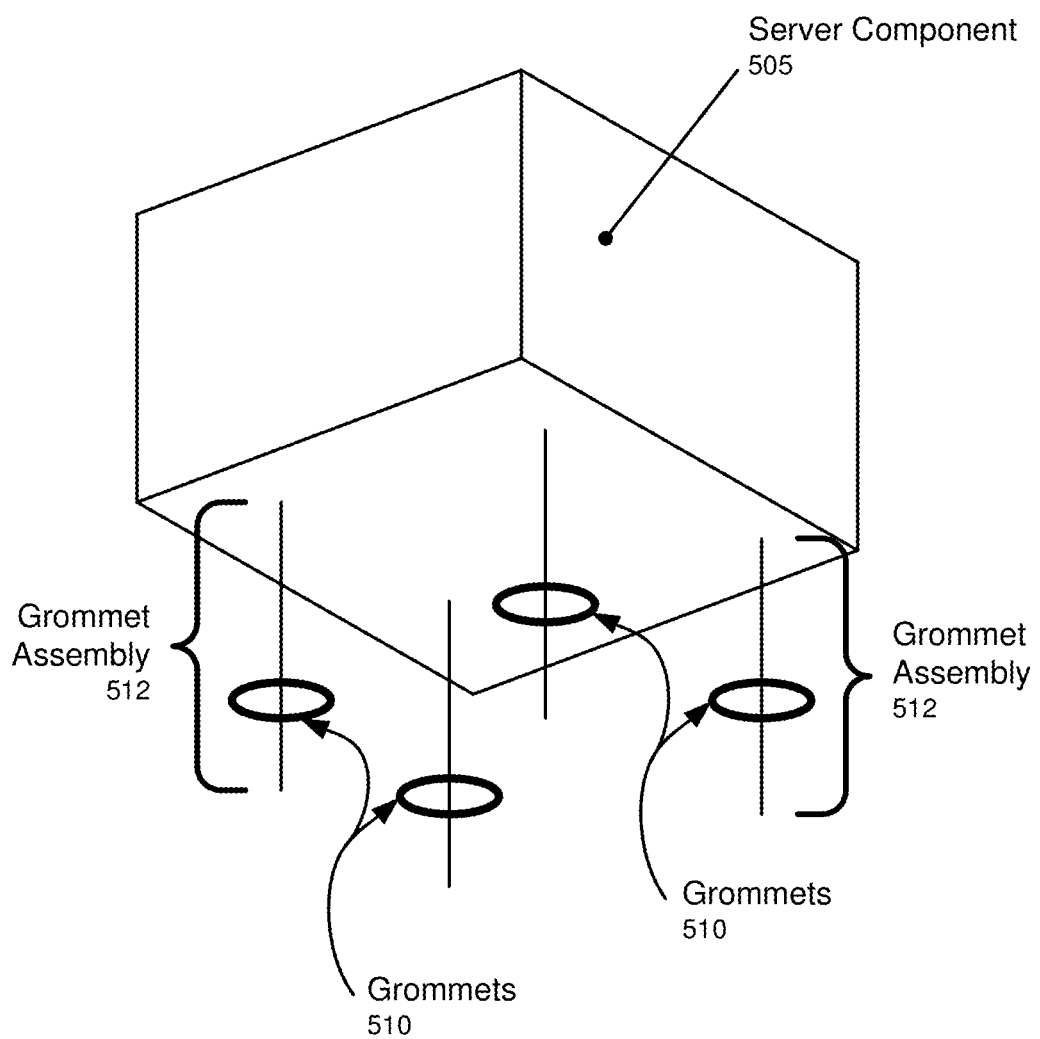
FIG. 5A shows a server component in accordance with one or more embodiments of the invention.

FIG. 5A shows a server component (505) in accordance with one or more embodiments of the invention. The server component (505) may correspond to a hard drive; a memory; a processor; a co-processor for floating point arithmetic, graphics, signal processing, string processing, encryption or I/O Interfacing with peripheral devices; or any other hardware component that may be present within a server. Although FIG. 5A shows the server component (505) as having a rectangular box shape, the server component (505) may have any shape and may be of any size.

In one or more embodiments of the invention, there exists multiple grommet assemblies (512) each having at least one grommet (510). The grommet assemblies (512) make it possible for the grommets (510) to grip the server component (505). For example, the grommet assemblies (512) may include screws/legs/extensions that attach to the server component (505). The grommets (510) are effectively able to grip the server component (505) by gripping the screws/legs/prongs attached to the server component (505). In one or more embodiments of the invention, the grommet assemblies (512) are optional. In such embodiments, the shape and/or structure or the server component (505) permit the grommets (510) to directly grip the server component (505).

Figure 5B:
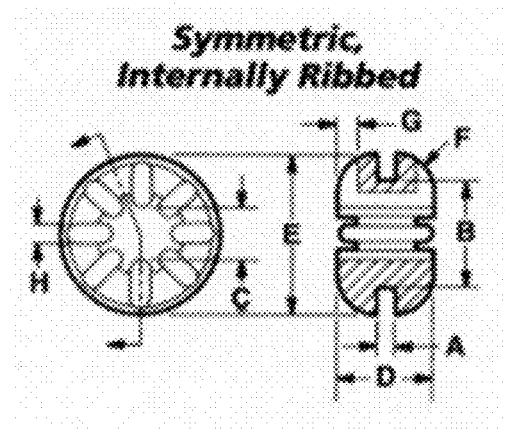
FIG. 5B shows grommet dimensions in accordance with one or more embodiments of the invention.

The grommets (510) are used to install the server component (505) in a server component bracket (discussed below). Although FIG. 5A shows four grommets (510) gripping the server component (505), any number of grommets (510) may be used to grip the server component (505). Once the server component is installed in a server component bracket, the grommets (510) may effectively isolate, at least partially, the server component (505) from electrical, thermal, and/or vibration type disturbances. FIG. 5B specifies the grommet dimensions (515) and the grommet composite material (520).

Figure 6A:
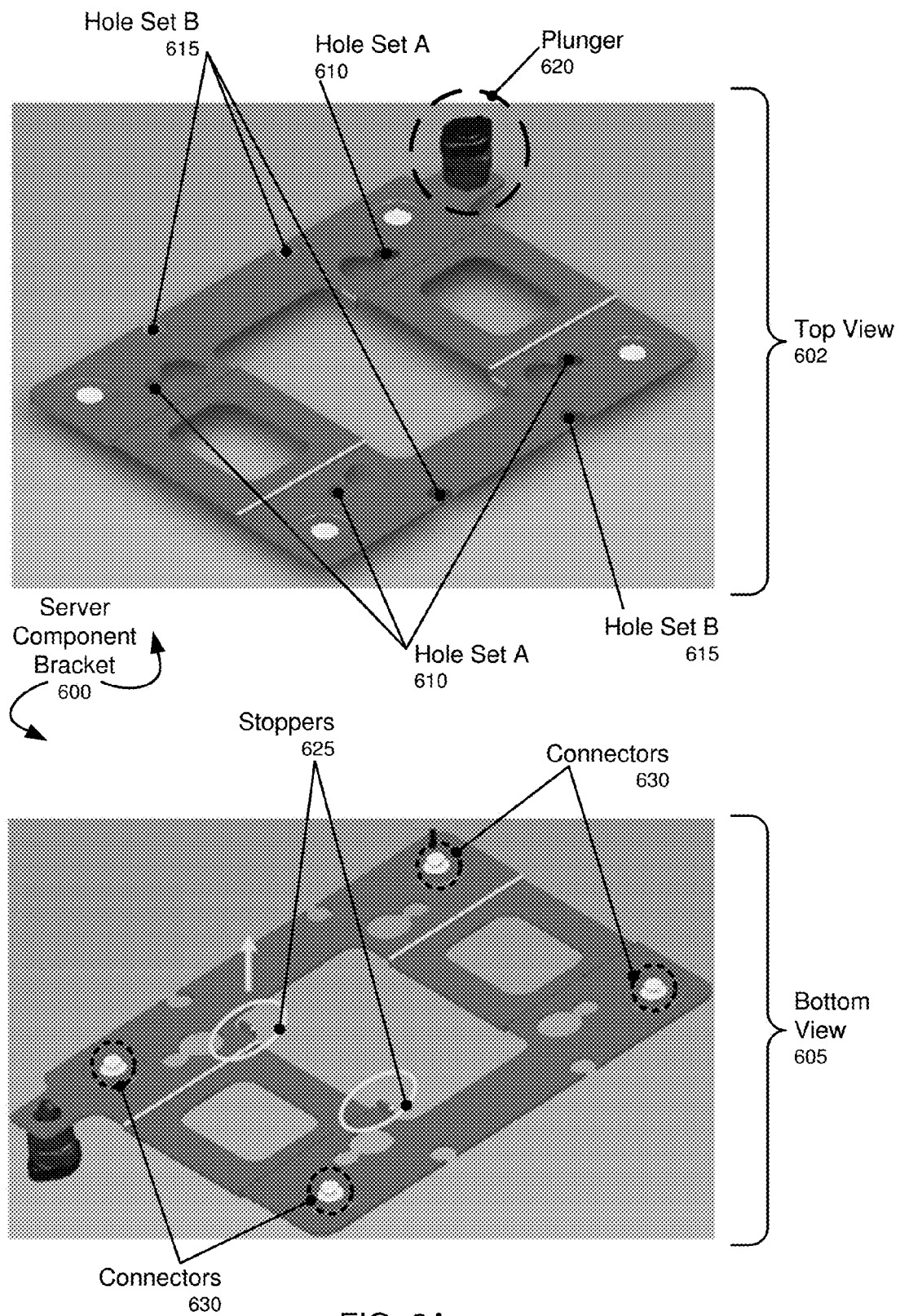
FIG. 6A, FIG. 6B, and FIG. 6C show a server component bracket in accordance with one or more embodiments of the invention.

FIG. 6A shows a top view (602) and a bottom view (605) of a server component bracket (600) in accordance with one or more embodiments of the invention. As shown in FIG. 6A, the server component bracket (600) includes one or more sets of holes (i.e., Hole Set A (610), Hole Set B (615)). The holes of a hole set (610, 615) are configured to secure the grommets gripping a server component (e.g., grommets (510) gripping server component (505), discussed above in reference to FIG. 5).

As shown in FIG. 6A, the holes of hole set A (610) may intersect with the perimeter (i.e., edges) of the server component bracket (600). In contrast, the holes of hole set B (615) are located within the perimeter (i.e., do not intersect with the perimeter/edges) of the server component bracket (600). By having multiple hole sets (610, 615), the server component bracket (600) may be used with various numbers and arrangements of grommets, and thus various server components. In one or more embodiments of the invention, the server component bracket (600) only has one set of holes. Further, although each set (610, 615) is shown as having four holes, each set (610, 615) may have any number of holes.

In one or more embodiments of the invention, the server component bracket (600) includes a plunger (620). The plunger (620) extends vertically (or approximately vertically) from the top surface of the server component bracket (600). Further, the plunger (620) includes a pin (not shown). When the plunger (620) is activated by an operator/user, the plunger (620) forces (e.g., using a spring) the pin to project outwards from and orthogonal (or approximately orthogonal) to the bottom surface of the server component bracket (600). External force is required to place the pin back into the plunger (620). Further, the plunger (620) may generate an audio verification each time the pin is extended outwards from the bottom surface of the server component bracket (600). The plunger (620) may be designed to generate an audio verification within a predetermined decibel range and/or a predetermined frequency range. The size, shape, and material composition of the plunger (620) are all design factors that control the loudness and frequency of the audio verification. When the plunger (620) is deactivated, the pin is withdrawn into the plunger (620) and no longer projects outwards from the bottom surface of the server component bracket (600).

In one or more embodiments of the invention, the server component bracket (600) includes multiple connectors (630). The connectors (630) are used to install the server component bracket (600) into a server chassis bracket (e.g., server chassis bracket (410), discussed above in reference to FIG. 4B). In one or more embodiments of the invention, the connectors (630) are T-pins. Although FIG. 6A shows four connectors (630), the server component bracket (600) may have any number of connectors.

In one or more embodiments of the invention, the server component bracket (600) includes one or more stoppers (625). The stoppers are used during removal (i.e., un-installment) of the server component bracket from the server chassis bracket. Specifically, the one or more stoppers (625) are used to prevent over-sliding of the server component bracket (600) (discussed below).

Figure 6B:
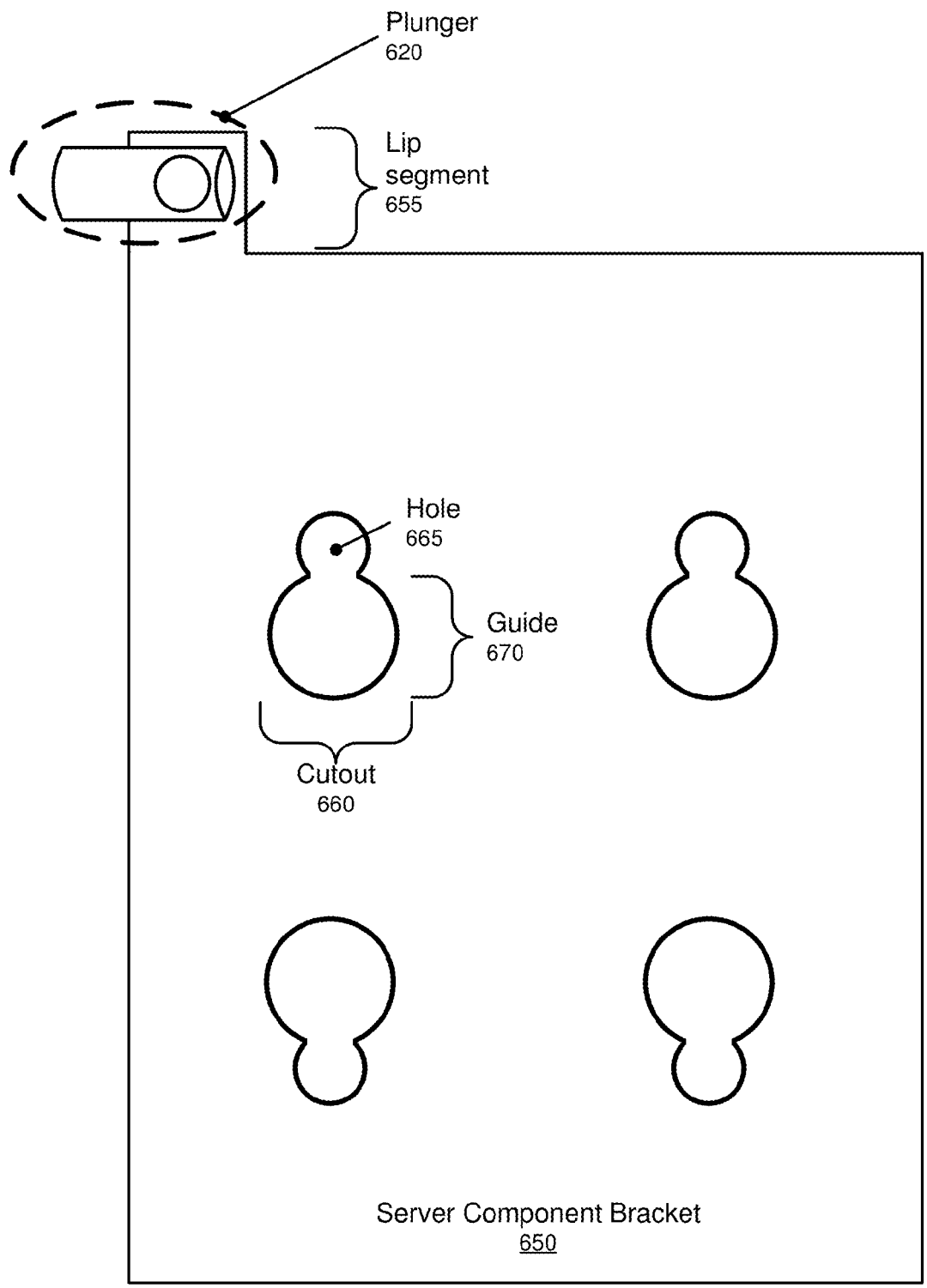

FIG. 6B shows a server component bracket (650) in accordance with one or more embodiments of the invention. The server component bracket (650) may be similar to the server component bracket (600), discussed above in reference to FIG. 6A. As shown in FIG. 6B, the server component bracket (650) includes a lip segment (655) and the plunger (620) is located on the lip segment (655).

Still referring to FIG. 6B, the server chassis bracket (650) has multiple cutouts (i.e., Cutout (660)) and each cutout has a hole (e.g., Hole (665)) and a guide (e.g., Guide (670)). The boundary between a hole and a guide within a cutout is referred to as a neck. In one or more embodiments of the invention, the neck corresponds to the most narrow part of a cutout.

In one or more embodiments of the invention, an installed server component sits on top of the server component bracket (650). Specifically, the holes (e.g., Hole (665)) are used to secure the grommets (e.g., grommets (510)) gripping the server component. In other words, the grommets effectively plug the holes. Following successful installation, a part of each grommet remains on top of the cutout, while a different part of each grommet remains below the cutout.

In one or more embodiments of the invention, the guides (e.g., Guide (670)) are used to slide the grommets gripping a server component towards the holes (e.g., Hole (665)). Specifically, at the start of the installation process, the grommets gripping a server component are inserted into the guides of the cutouts by an operator. The grommets, and their corresponding server component, may be then slid in a direction towards the holes along the guides. Upon reaching the necks of the cutouts, the operator may need to exert additional force to push the grommets past the necks and into the holes.

In one or more embodiments of the invention, the spacing and alignment of the holes, and the locations of the grommets correspond to the screws/legs extending from a standard 3.5" hard drive. In one or more embodiments of the invention, the spacing and alignment of the holes, and the locations of the grommets correspond to screws/legs extending from a standard 2.5" hard drive.

Figure 6C:
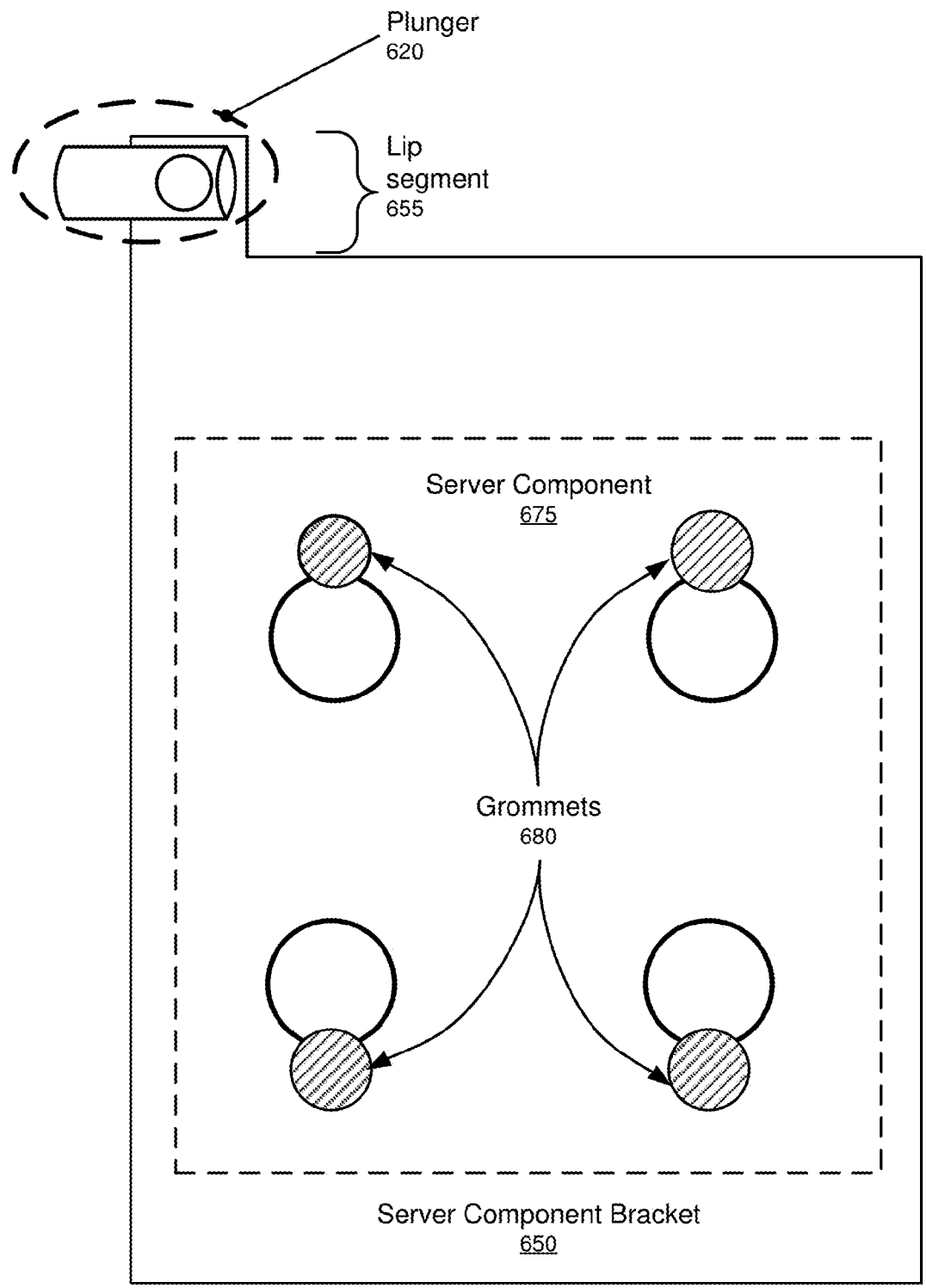

FIG. 6C shows the server component bracket (650) following successful installation of a server component (675). As discussed above, server component (675) sits above the server component bracket (650). In FIG. 6C, only the outline (i.e., footprint) of the server component (675) is shown. There exists four grommets (i.e., grommets (680)) gripping the server component (675). As shown in FIG. 6C, the grommets (680) are plugging the holes of the cutouts.

Figure 7A:
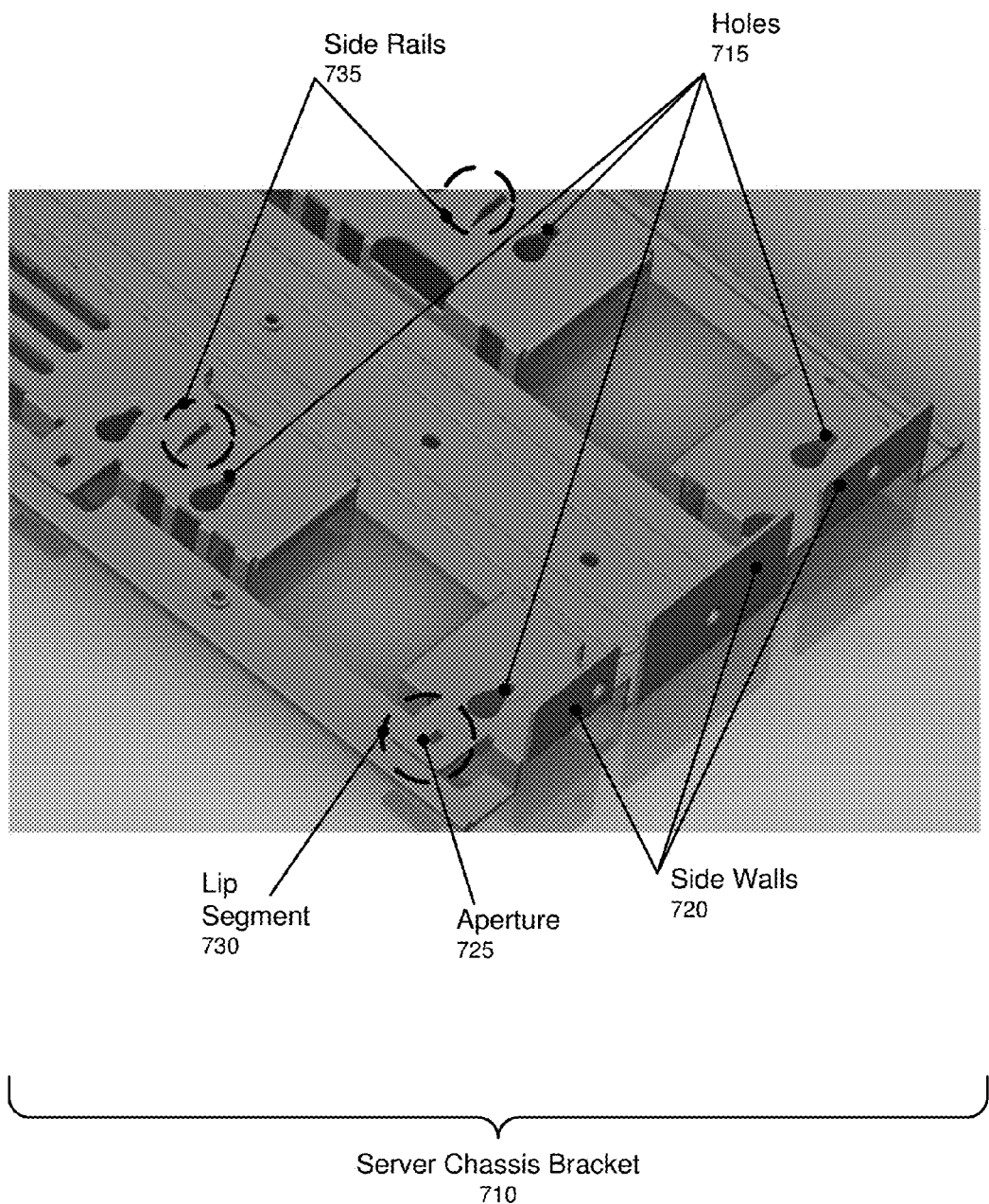
FIG. 7A, FIG. 7B, and FIG. 7C show a server chassis bracket in accordance with one or more embodiments of the invention.

FIG. 7A shows a server chassis bracket (710) in accordance with one or more embodiments of the invention. The server chassis bracket (710) may be essentially the same as the server chassis bracket (410), discussed above in reference to FIG. 4B. In one or more embodiments of the invention, the server chassis bracket (710) has the following dimensions: 17"W, 32.5"D, 1.75"H, and all sheet metals are 0.5 mm thick.

As shown in FIG. 7A, the server chassis bracket (710) has multiple features including one or more holes (715), a lip segment (730) having an aperture (725), one or more side rails (735), and one or more side walls (720). Each of these features is discussed below.

In one or more embodiments of the invention, the server chassis bracket (710) includes multiple side walls (720). The side walls (720) are used to secure the server chassis bracket (710) to a server chassis (e.g., server chassis (405)). The side walls (720) may be essentially the same as the side walls discussed above in reference to FIG. 4A and FIG. 4B.

In one or more embodiments of the invention, the server chassis bracket (710) include multiple holes (715). The holes (715) are used to secure the multiple connectors (e.g., T-pins) of one or more server component brackets. The holes (715) may be of any size or shape. Moreover, there may be any number of holes. In one or more embodiments of the invention, the server chassis bracket (710) has four holes per server component bracket.

In one or more embodiments of the invention, the server chassis bracket (710) includes one or more side rails (735). The side rails (735) may extend vertically from the top of the server chassis bracket (710). Moreover, each side rail (735) may include a face that is parallel (or approximately parallel) with the side walls (720). The face may have any shape including an arc/sector, a triangle, a quadrilateral, etc. In order to install the server component bracket (600) into the server chassis (710), the connectors (630) of the server component bracket (600) must be slid into the holes (715) of the server chassis bracket (710). In one or more embodiments of the invention, the one or more side rails (735) are used to guide/align an edge of the server component bracket (600) during the sliding by an operator/user. Accordingly, the one or more side rails (735) are effectively configured/used to guide the multiple connectors (630) into the holes (715) during installation of the server component bracket (600).

In one or more embodiments of the invention, the server chassis bracket (710) includes a lip segment (730) with an aperture (725). Following a successful installation of the server component bracket (600), the pin of the plunger (620) will be positioned above/over the aperture (725). Accordingly, if the plunger (620) is activated, the pin will be inserted into the aperture (725). Moreover, the plunger (620) will generate an audio verification in response to the pin being inserted into the aperture (725), designating successful installation of the server component bracket (600). The plunger (620) may be designed to generate an audio verification within a predetermined decibel range and/or a predetermined frequency range. The size, shape, and material composition of the plunger (620) are all design factors that control the loudness and frequency of the audio verification. If the plunger (620) is deactivated, the pin will be removed from the aperture (725), and withdrawn into the plunger (620). In one or more embodiments of the invention, the lip segment (730) is optional. In such embodiments, the aperture (725) exists somewhere within the interior of the server chassis bracket (710).

Figure 7B:
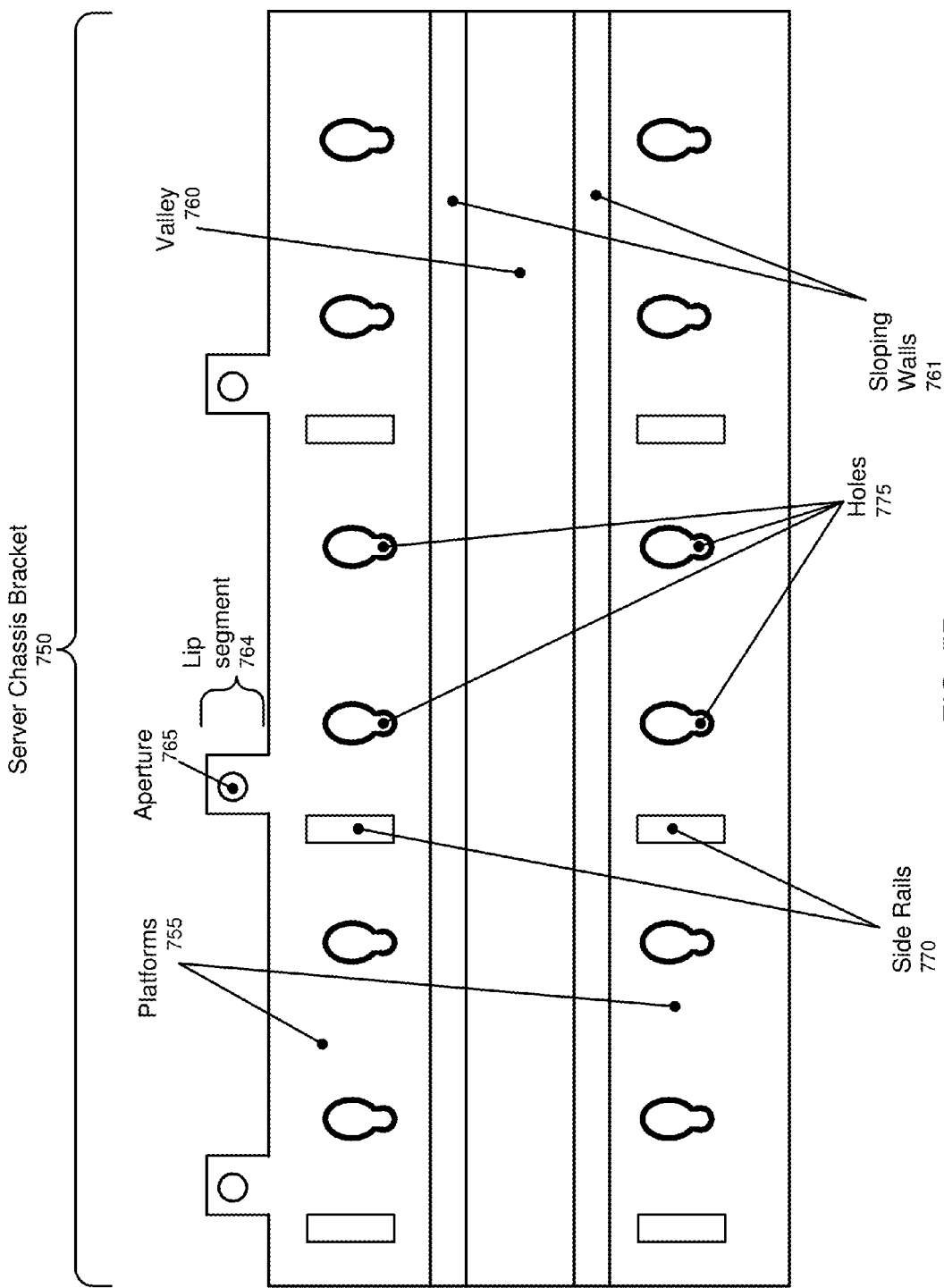

FIG. 7B shows a server chassis bracket (750) in accordance with one or more embodiments of the invention. As shown in FIG. 7B, the server chassis bracket (750) includes one or more holes (775), one or more apertures located on one or more lip segments (e.g., aperture (765) located on lip segment (764)), and one or more side rails (770). The server chassis bracket (750) may be essentially the same as the server chassis bracket (710), discussed above in reference to FIG. 7A. Accordingly, the holes (775), the aperture (765), the lip segment (764), and the side rails (770) are essentially the same as the holes (715), the aperture (725), the lip segment (730), and the side rails (735), respectively, discussed above in reference to FIG. 7A.

Still referring to FIG. 7B, there exists two platforms (755). All of the holes (775) are located on the platforms (755). Between and below the platforms (755), there exists a valley (760). The valley (760) is joined to the platforms (755) by sloping walls (761). The slopping walls (761) may have any amount of incline, including 90 degrees. The valley (760) and the slopping walls (761) effectively create a cavity between the platforms (755).

Although not labeled, each hole (775) may be part of a cutout also having a guide. Each hole and its corresponding guide are separated in the cutout by a neck. In one or more embodiments of the invention, the guides are used to slide the connectors (630) of the server component bracket (600) towards the holes (775) during installation. Specifically, at the start of the installation process, the connectors (630) are inserted/slid into the guides of the cutouts while the server component bracket (600) is slid along the side rails (770) by an operator/user. The connectors (630), and thus the server component bracket (600), may then be slid in a direction towards the holes (775) along the guides. Upon reaching the necks of the cutouts, the operator/user may need to exert additional force to push the connectors past the necks and into the holes (775).

Figure 7C:
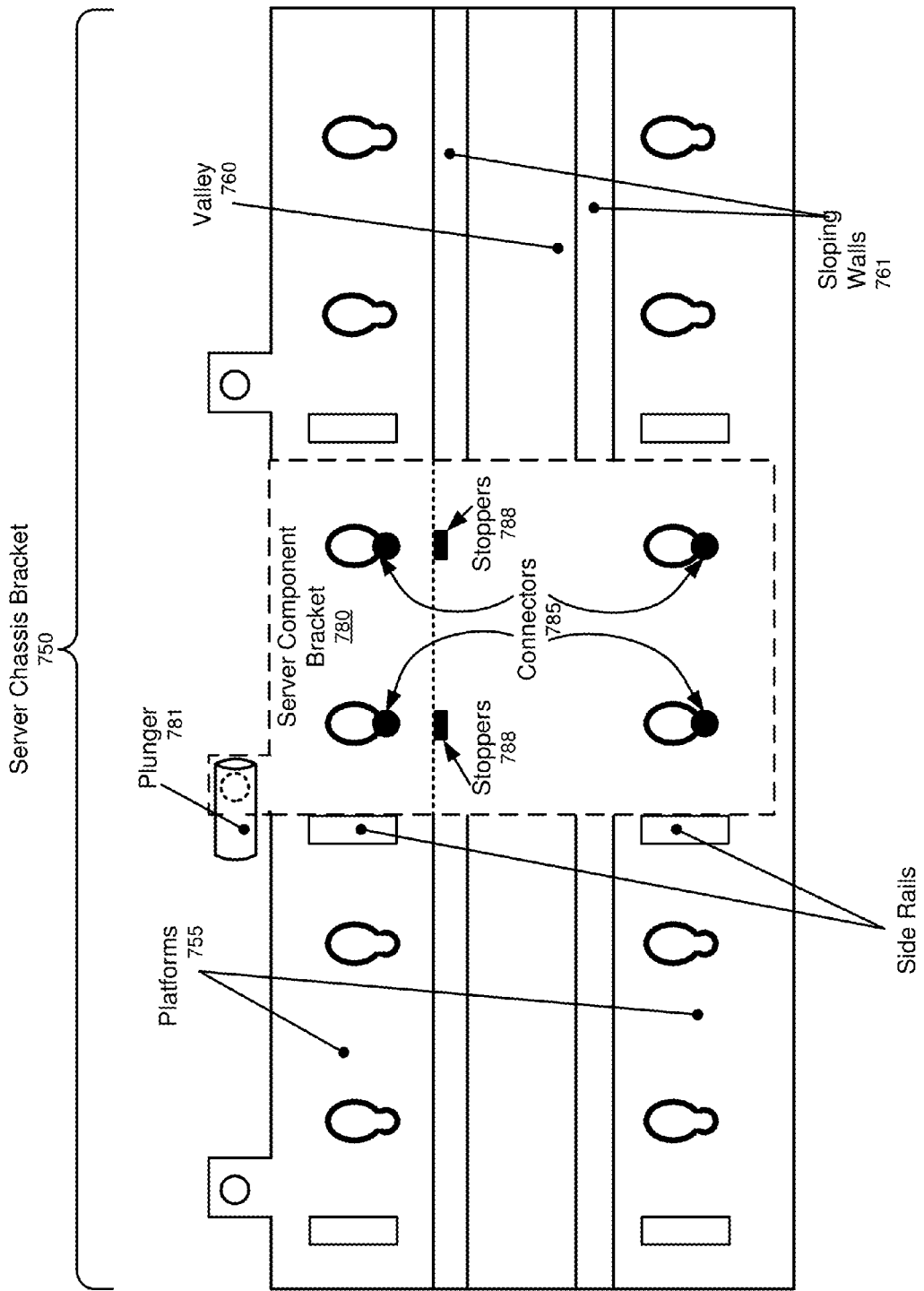

FIG. 7C shows the server chassis bracket (750) during/following successful installation of a server component bracket (780) in accordance with one or more embodiments of the invention. The server component bracket (780) may be essentially the same as the server component bracket (600), discussed above in reference to FIG. 6A. As discussed above, the server component bracket (780) is installed in the server chassis bracket (750). In FIG. 7C, only the outline (i.e., footprint) of the server component bracket (780) is shown. During installation, the operator/user slides an edge of the server component bracket (780) along the one or more slide rails (770) of the server chassis bracket (750). By sliding the server component bracket (780) along the slide rails (770), the connectors (785) of the server component bracket (780) are guided into the holes of the server chassis bracket (750). Moreover, following successful installation of the server component bracket (780), the pin of the plunger (781) is positioned over the aperture of the server chassis bracket (750). As the plunger (781) is activated, the pin will be inserted into the aperture and an audio verification will be generated.

In one or more embodiments of the invention, in order to remove the server component bracket (780) (e.g., to service the server component (not shown) attached to the server component bracket (780)), the plunger (781) is first deactivated. This removes the pin of the plunger (781) from the aperture. Then, the server chassis bracket (750) is slid in the reverse direction along the side rails (770). The sliding may continue until one or more stoppers (788) of the server component bracket make contact with a slopping wall (761) of the server component bracket (780). Once contact is made, the server component bracket (780) (along with the attached server component) may be lifted from the server chassis bracket (750).

Figure 8:
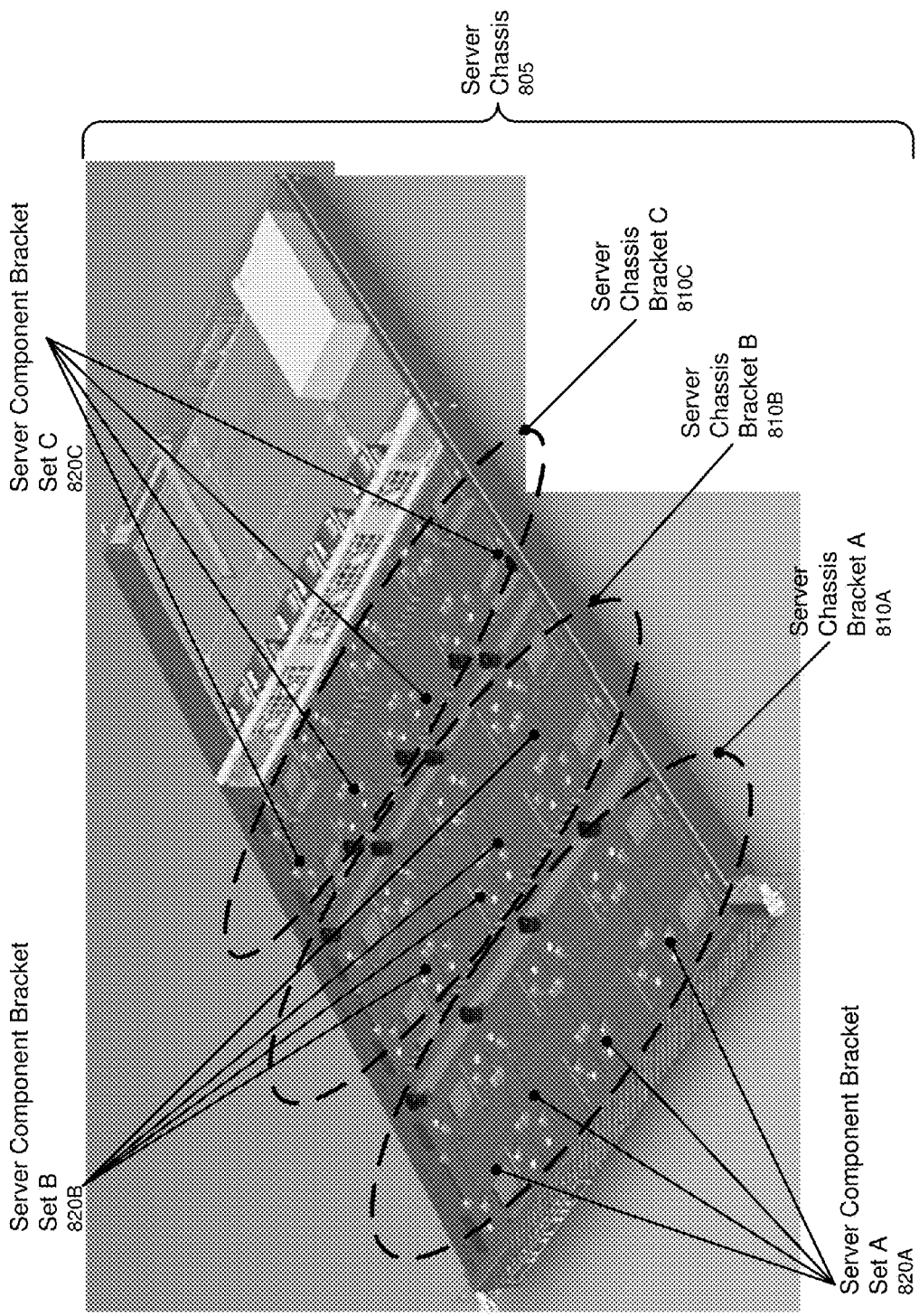
FIG. 8 shows a server chassis in accordance with one or more embodiments of the invention.

FIG. 8 shows a server chassis (805) in accordance with one or more embodiments of the invention. The server chassis (805) may be essentially the same as the server chassis (405), discussed above in reference to FIG. 4A and FIG. 4B. As shown in FIG. 8, multiple server chassis brackets (i.e., Server Chassis Bracket A (810A), Server Chassis Bracket B (810B), Server Chassis Bracket C (810C)) are riveted to the server chassis (805). Moreover, each server chassis bracket (810A, 810B, 810C) includes multiple server component brackets. For example, server chassis bracket A (810A) includes server component bracket set A (820A), server chassis bracket B (810B) includes server component bracket set B (820B), and server chassis bracket C (810C) includes server component bracket set C (820C). Although not shown, a server component is attached to each server component bracket. In the configuration shown in FIG. 8, a total of 12 server components (i.e., 3 server chassis brackets×4 server component brackets per server chassis bracket×1 server component per server component bracket=12 server components) are installed in the server chassis (805).

As shown in FIG. 8, server component bracket set A (820A) and server component bracket set B (820B) have the same orientation. Accordingly, the server component brackets of both sets (820A, 820B) are installed by sliding the server component brackets towards the front of the server chassis (805) Moreover, the server components of both sets (820A, 820B) are removed by sliding the server component brackets towards the back of the server chassis (805). In contrast, server component bracket set C (820C) has the opposite orientation. Accordingly, the sliding directions for installation and removal for server component bracket set C (820C) are opposite those of server component bracket sets A and set B (820A, 820C).

Figure 9A:
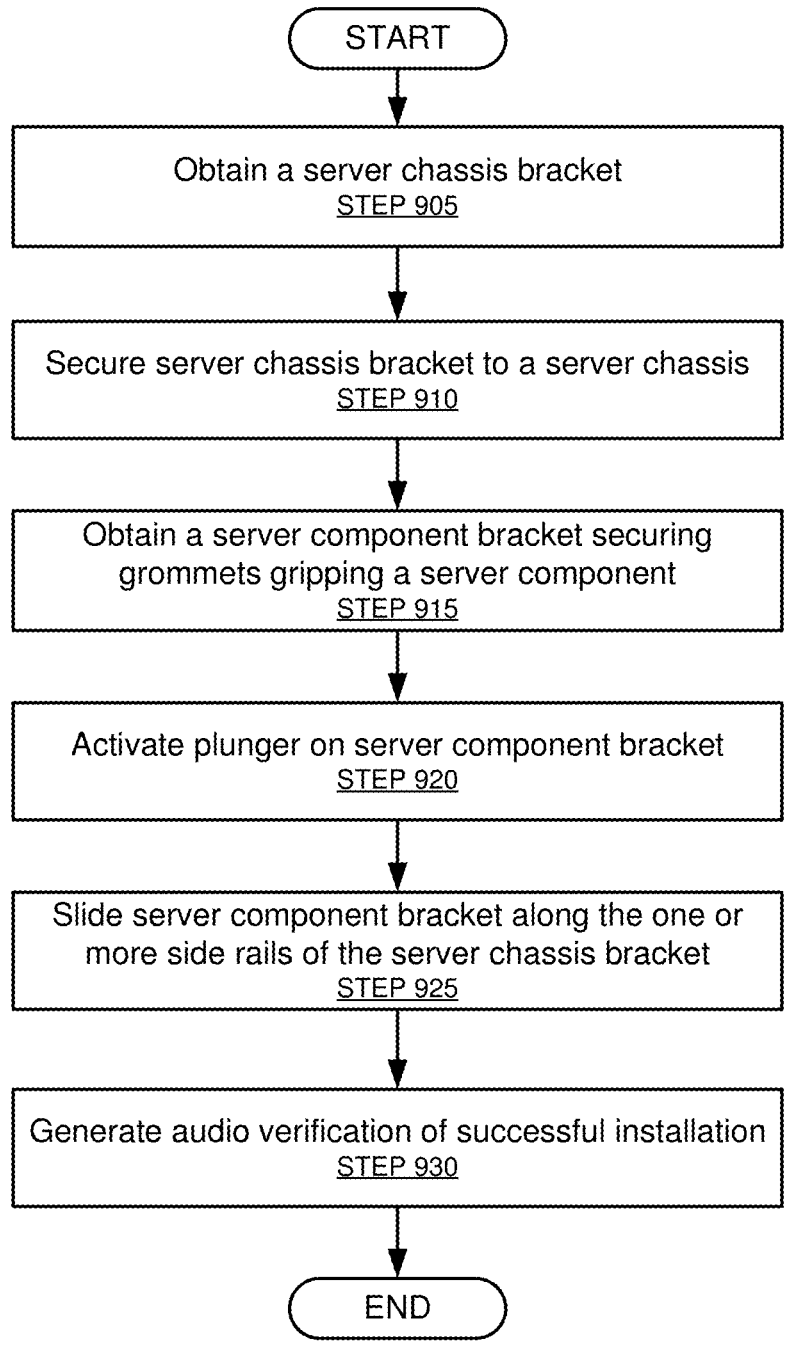
FIG. 9A and FIG. 9B show flowcharts in accordance with one or more embodiments of the invention.

FIG. 9A shows a flowchart in accordance with one or more embodiments of the invention. One or more steps shown in FIG. 9A may be omitted, repeated, and/or performed in a different order among different embodiments of the invention. Accordingly, embodiments of the invention should not be considered limited to the specific number and arrangement of steps shown in FIG. 9A.

Initially, a server chassis bracket is obtained (STEP 905). The server chassis bracket may be essentially the same as server chassis bracket (750), discussed above in reference to FIG. 7B and FIG. 7C. Accordingly, the obtained server chassis bracket may include multiple holes, multiple side rails, side walls, and multiple apertures on multiple lip segments. The holes may be located on platforms separated by a valley. Sloping walls may create the valley.

In STEP 910, the server chassis bracket is secured to a server chassis. As discussed above, the server chassis is the outer shell of a server. Accordingly, the server chassis has sides and a floor. The server chassis may also have a lid. As discussed above, multiple server components may be (eventually) installed on the server chassis bracket. As more and more items (e.g., circuit boards, server components, electrical wiring, fan, fan walls, metal hardware, etc.) are mounted/installed/placed within the server chassis, the floor of the server chassis may begin to sag from the weight of these items. The sagging may interfere with the tight clearance between neighboring servers in a server rack. Specifically, the sagging may prohibit close placement of neighboring servers within a server rack and thus reduce the overall capacity of the server rack.

The sidewalls of the server chassis bracket are secured (e.g., using rivets) to the server chassis. As the width of the server chassis bracket is slightly less than the width of the server chassis, by securing the sidewalls of the server chassis bracket to the sides of the server chassis, the sides of the server chassis are compressed, and the floor of the server chassis bows upwards. This bowing may act as a countermeasure to the sagging. In other words, this bowing may reduce or even eliminate the sagging, and thus permit close placement of neighboring servers within a server rack (i.e., increasing capacity of the server rack). The floor of the server chassis may also be secured to the server chassis bracket. This too reduces the sagging by encouraging the floor of the server chassis to bow upwards.

In STEP 915, a server component bracket securing grommets gripping a server component is obtained. The obtained server component bracket may be essentially the same as the server component bracket (650), discussed above in reference to FIGS. 6B and 6C. Accordingly, the server component bracket also includes a plunger with a pin, multiple connectors, and one or more stoppers. The server component may correspond to a hard drive, a memory, a processor, a co-processor, or any other hardware component that may be present within the server. In one or more embodiments of the invention, four grommets are used to grip the server component. The grommets plug the holes of the server component bracket.

In STEP 920, the plunger is activated. When the plunger is activated, the plunger forces (e.g., using a spring) the pin to project outwards from and orthogonal (or approximately orthogonal) to the bottom surface of the server component bracket. External force is required to place the pin back into the plunger. If the external force is removed while the plunger is still activated, the pin is once again projected outwards.

In STEP 925, the server component bracket (attached to the server component) is slid along one or more of the side rails of the server chassis bracket. The side rails guide/align the connectors of the server component bracket with the holes of the server chassis bracket. Further, the side rails position the pin of the plunger over the aperture of the server chassis bracket. The sliding continues until the connectors plug the holes of the server chassis bracket and the pin of the plunger is inserted into the aperture. Until the pin is properly positioned above the aperture, the lip segment on which the aperture is located forces (i.e., the lip segment acts as an external force) the pin back into the plunger.

In STEP 930, an audio verification is generated by the plunger. The audio verification is generated in response to the pin being inserted into the aperture and thus successful installation of the server component bracket into the server component chassis. Because of the audio verification, the operator/user does not need to have visual contact with the server component bracket being installed. The plunger may be designed to generate an audio verification within a predetermined decibel range and/or a predetermined frequency range. The size, shape, and material composition of the plunger are all design factors that control the loudness and frequency of the audio verification.

Those skilled in the art, having the benefit of this detailed description, will appreciate that STEP 915, STEP 920, STEP 925, and STEP 930 may be performed for any number of server component brackets.

Figure 9B:
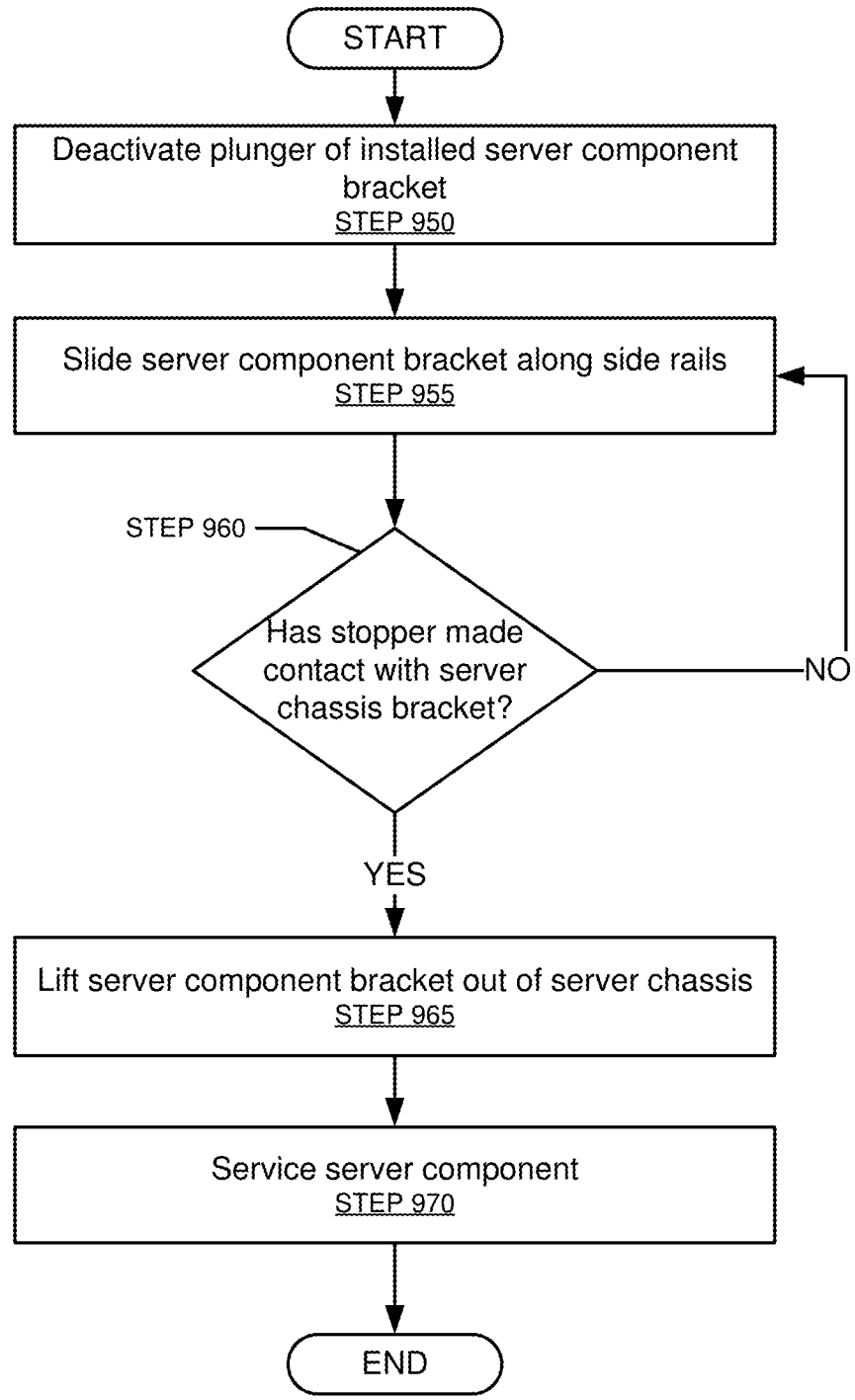

FIG. 9B shows a flowchart in accordance with one or more embodiments of the invention. One or more steps shown in FIG. 9B may be omitted, repeated, and/or performed in a different order among different embodiments of the invention. Accordingly, embodiments of the invention should not be considered limited to the specific number and arrangement of steps shown in FIG. 9B. The steps shown in FIG. 9B may be executed after the steps of FIG. 9A.

Initially, the plunger of an installed server component bracket is deactivated (STEP 950). By deactivating the plunger, the pin of the plunger is removed from the aperture of the server chassis bracket.

In STEP 955, the server component bracket (with the attached server component) is slid along the side rail(s) of the server chassis bracket. The sliding direction is opposite the sliding direction during installation of the server component bracket. The sliding removes/dislodges the connectors from the holes of the server chassis bracket.

In STEP 960, it is determined whether the stoppers of the server component bracket have made contact the server chassis bracket. When it is determined that contact has been made, the process proceeds to STEP 965. Otherwise, the process returns to STEP 955.

In STEP 965, the server component bracket (and the attached server component) are free of the server chassis bracket and can be lifted from the server chassis. In STEP 970, the server component may be serviced.

Those skilled in the art, having the benefit of this detailed description, will appreciate that the steps of FIG. 9B may be performed for any number of server component brackets installed in the server chassis bracket.

Embodiments of the invention may have one or more of the following advantages: the ability to install multiple (e.g., four) server components on a single server chassis bracket; the ability to install three server chassis brackets within a single server chassis; the ability to have 12 server components (e.g., hard drives) within a single server chassis; the ability to generate an audio confirmation of a successful server component bracket installation using a plunger; the ability to install a server component in a server chassis bracket without visual contact but instead by relying on the audio confirmation; the ability to reduce the sagging of a server chassis floor and thus improve/increase capacity of a server rack; the ability to reduce the sagging of a server chassis floor by securing (e.g., riveting) the sidewalls of one or more server chassis brackets to the sides of the server chassis; the ability to reduce the sagging of a server chassis floor by securing the floor to one or more server chassis brackets; the ability to align and guide the connectors of a server component bracket using one or more side rails of a server chassis bracket; the ability to isolate the server components from vibrations using grommets; the ability to lock the server component bracket to the server chassis bracket using a pin and an aperture; etc.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An apparatus, comprising:
a first server component bracket comprising:
a first plurality of holes configured to secure a plurality of grommets gripping a server component;
a plurality of connectors; and
a plunger comprising a pin and configured to generate an audio verification of successful installation of the first server component bracket; and
a server chassis bracket comprising:
a plurality of sidewalls;
a second plurality of holes configured to secure the plurality of connectors of the first server component bracket;
a side rail configured to guide the plurality of connectors into the second plurality of holes; and
an aperture configured to secure the pin of the plunger following successful installation of the first server component bracket into the server chassis bracket.

2. The apparatus of claim 1, the first server component bracket further comprising:
a stopper configured to prevent over-sliding of the first server component bracket by making contact with the server chassis bracket during removal of the first server component bracket.

3. The apparatus of claim 1, the first server component bracket further comprising a perimeter, wherein each of the first plurality of holes intersect with the perimeter.

4. The apparatus of claim 1, wherein each of the plurality of connectors is a T-pin.

5. The apparatus of claim 1, the first server component bracket further comprising a guide, wherein the guide and a hole of the first plurality of holes are separated by a neck within a cutout.

6. The apparatus of claim 1, wherein the server component is a hard disk, and wherein the plurality of grommets insulate the hard disk from vibrations.

7. The apparatus of claim 1, the server chassis bracket further comprising a third plurality of holes for securing a second server component bracket.

8. The apparatus of claim 1, further comprising:
a plurality of rivets securing the plurality of sidewalls to a server chassis comprising a floor and a plurality of sides,
wherein securing the plurality of sidewalls reduces sagging of the server chassis by compressing the plurality of sides and bowing the floor.

9. The apparatus of claim 1, wherein:
the first server component bracket comprises a first lip segment;
the plunger is located on the first lip segment;
the server chassis bracket comprises a second lip segment; and
the aperture is located on the second lip segment.

10. A server chassis, comprising:
a floor and a plurality of sides;
a first server chassis bracket comprising a plurality of sidewalls;
a first plurality of rivets securing the plurality of sidewalls to the plurality of sides and reducing sagging of the floor by compressing the plurality of sides and bowing the floor; and
a first plurality of server component brackets comprising:
a plurality of connectors installed in the first server chassis bracket;
a first plurality of holes configured to secure a plurality of grommets gripping a first plurality of server components; and
a plurality of plungers comprising a plurality of pins and configured to generate a plurality of audio verifications following successful installation of the first plurality of server component brackets.

11. The server chassis of claim 10, further comprising:
a second plurality of rivets securing the first server chassis bracket to the floor.

12. The server chassis of claim 10, the first plurality of server component brackets further comprising:
a plurality of stoppers configured to prevent over-sliding of the first plurality of server component brackets by making contact with the first server chassis bracket during removal of the first plurality of server component brackets.

13. The server chassis of claim 12, the first server chassis bracket further comprising:
a second plurality of holes configured to secure the plurality of connectors;
a plurality of side rails configured to guide the plurality of connectors into the second plurality of holes; and a plurality of apertures configured to store the plurality of pins following successful installation of the first plurality of server component brackets into the first server chassis bracket, wherein the first plurality of server components comprises at least one hard drive.

14. The server chassis of claim 12, further comprising:
a second server chassis bracket; and
a second plurality of server component brackets installed in the second server chassis bracket and securing a second plurality of server components,
wherein the first plurality of server component brackets slide in a first direction during removal from the first server chassis bracket,
wherein the second plurality of server component brackets slide in a second direction during removal from the second server chassis bracket, and
wherein the first direction and the second direction are opposite.

15. A method, comprising:
obtaining a server component bracket comprising:
    a first plurality of holes securing a plurality of grommets gripping a server component;
    a plunger comprising a pin; and
    a plurality of connectors;
obtaining a server chassis bracket comprising:
    a plurality of sidewalls;
    a second plurality of holes;
    a side rail; and
    an aperture;
activating the plunger; and
sliding the server component bracket along the side rail to guide the plurality connectors into the second plurality of holes and to position the pin above the aperture,
wherein the plunger inserts the pin into the aperture and generates an audio verification confirming successful installation of the server component bracket into the server chassis bracket.

16. The method of claim 15, further comprising:
obtaining a server chassis comprising a plurality of walls and a floor; and
securing the plurality of sidewalls to the plurality of sides;
wherein securing the plurality of sidewalls reduces sagging of the floor by compressing the plurality of sides and bowing the floor.

17. The method of claim 16, wherein:
the first plurality of holes intersect a perimeter of the server component bracket; and
the plurality of connectors are T-pins.

18. The method of claim 16, further comprising:
isolating, using the plurality of grommets, the server component from vibrations generated within the server chassis.

19. The method of claim 16, further comprising:
removing the pin from the aperture by deactivating the plunger;
sliding the server component bracket along the slide rail until the stopper strikes the server chassis bracket; and
lifting the server component bracket off the server chassis bracket.

20. The method of claim 19, wherein the server component is a hard drive.

* * * * *